US008482258B2

(12) United States Patent  (10) Patent No.: US 8,482,258 B2
Jones et al.  (45) Date of Patent: Jul. 9, 2013

(54) DEVICE AND METHOD FOR MONITORING LIFE HISTORY AND CONTROLLING MAINTENANCE OF INDUSTRIAL BATTERIES

(75) Inventors: Duncan Jones, Manchester (GB); John Worthington, Bacup (GB)

(73) Assignee: Philadelphia Scientific LLC, Montgomeryville, PA (US)

( * ) Notice: Subject to any disclaimer, the term of this patent is extended or adjusted under 35 U.S.C. 154(b) by 1527 days.

(21) Appl. No.: 11/817,734

(22) PCT Filed: Mar. 6, 2006

(86) PCT No.: PCT/US2006/008068
§ 371 (c)(1),
(2), (4) Date: Sep. 4, 2007

(87) PCT Pub. No.: WO2009/094287
PCT Pub. Date: Sep. 8, 2006

(65) Prior Publication Data
US 2008/0186028 A1  Aug. 7, 2008

Related U.S. Application Data

(60) Provisional application No. 60/676,502, filed on Apr. 29, 2005, provisional application No. 60/658,546, filed on Mar. 4, 2005.

(51) Int. Cl.
*H02J 7/00*  (2006.01)

(52) U.S. Cl.
USPC .................. 320/136; 320/134; 324/427

(58) Field of Classification Search
USPC .................. 320/134, 136, 157; 324/427, 432
See application file for complete search history.

(56) References Cited

U.S. PATENT DOCUMENTS

| | | | |
|---|---|---|---|
| 4,289,836 A | | 9/1981 | Lemelson |
| 5,525,890 A | | 6/1996 | Iwatsu et al. |
| 5,841,355 A | * | 11/1998 | Bae et al. ................. 340/635 |
| 5,895,440 A | * | 4/1999 | Proctor et al. ............. 702/63 |
| 5,936,382 A | | 8/1999 | Jones et al. |
| 6,549,014 B1 | | 4/2003 | Kutkut et al. |
| 7,394,224 B2 | * | 7/2008 | Wanibuchi et al. ........ 320/149 |
| 2005/0017685 A1 | * | 1/2005 | Rees et al. ................. 320/132 |

FOREIGN PATENT DOCUMENTS
EP  1482318 A2  12/2004

OTHER PUBLICATIONS

Linden, D., "Handbook of Batteries and Fuel Cells," McGraw-Hill Book Company, pp. 14-92 to 14-95, (Jan. 1984).
Australian Office Action dated Oct. 21, 2010, in related Australian Application No. 2006218360.
European Office Action dated Sep. 13, 2010, in related European Application No. EP 06 73 7261.5.
Australian Office Action dated Oct. 16, 2009, in related Australian Application No. 2006218360.

* cited by examiner

*Primary Examiner* — Edward Tso
*Assistant Examiner* — Aaron Piggush
(74) *Attorney, Agent, or Firm* — Fox Rothschild LLP

(57) ABSTRACT

This invention is a method and device for monitoring and storing data regarding the "life history" of a battery with which it is associated and interpreting the data to create an accurate record of use and abuse patterns. A manufacturer's specified life expectancy, measured in battery cycles, is established for the battery under normal use, and then the actual use of the battery is monitored and stored. Complete cycles, partial cycles, and operation of the battery outside of acceptable specifications are automatically derived into a value in units equivalent to a number of battery cycles, and this derivation is compared with the manufacturers life expectancy, and adjustments to the manufacturers life expectancy are made so that a more accurate and up-to-date estimation of battery life can be evolved over the life of the battery. The monitoring device is mounted on the battery for the lifetime of the battery, with certain information regarding the battery being displayed to all persons having access to the battery. Additional information may be made available to an authorized person or entity. This enables a lessor of the battery, for example, to identify abuse of the battery by a lessee and adjust fees, lease terms, etc. accordingly.

28 Claims, 5 Drawing Sheets

DEVICE AND METHOD FOR MONITORING LIFE HISTORY AND CONTROLLING MAINTENANCE OF INDUSTRIAL BATTERIES

CROSS-REFERENCE TO RELATED APPLICATIONS

This application is based on and claims priority to U.S. Provisional Application No. 60/658,546, filed Mar. 4, 2005, and U.S. Provisional Application No. 60/676,502, filed Apr. 29, 2005, both applications being fully incorporated herein by reference.

FIELD OF THE INVENTION

This invention relates to devices and methods for monitoring the operations of industrial batteries and, more particularly, to devices and methods for adjusting the estimated battery life of a particular battery based on its use history.

BACKGROUND OF THE INVENTION

Description of the Related Art

Battery monitoring devices of several types have been in general use for some time and are available on the market. U.S. Pat. No. 6,549,014 to Kutkut provides a typical example of one such device.

Most battery monitoring devices are simple data gathering devices that sample and store data regarding various battery parameters (voltage per cell, current, temperature, etc.) and optimally the data sampling and storage is performed on a continuous basis. This continuous sampling, however, requires large amounts of memory in which to store the data samples, and this increases both the cost and size of the battery monitor.

To reduce the amount of memory needed when sampling is performed for periods of long duration, one solution has been to reduce sampling resolution during those long periods by taking periodic representative samples. A problem exists, however, because the less frequently samples are taken, the less accurate the data image from those samples will be.

Another problem exists because known devices gather data sufficiently, but require the user to analyze the data and make a subjective judgment regarding what the data means and how it may affect the use of the battery. These devices may also require connection to a secondary device (e.g., a PC or other processor) for significant periods of time so that stored data can be retrieved prior to conducting such analysis.

SUMMARY OF THE INVENTION

This invention is a method and device for monitoring and storing data regarding the "life history" of a battery with which it is associated and interpreting the data to create an accurate record of use and abuse patterns. A manufacturer's specified life expectancy, measured in battery cycles, is established for the battery under normal use, and then the actual use of the battery is monitored and certain information regarding the use is stored. Complete cycles, partial cycles, and operation of the battery outside of acceptable specifications are automatically derived into a value in units equivalent to a number of battery cycles, and this derivation is compared with the manufacturers life expectancy, and adjustments to the manufacturers life expectancy are made so that a more accurate and up-to-date estimation of remaining battery life can be evolved over the life of the battery. The monitoring device is mounted on the battery for the lifetime of the battery, with certain information regarding the battery being displayed to all persons having access to the battery. Additional information may be made available to an authorized person or entity. This enables a lessor of the battery, for example, to identify abuse of the battery by a lessee and adjust fees, lease terms, etc. accordingly.

DETAILED DESCRIPTION OF THE PREFERRED EMBODIMENTS

Figure 1:
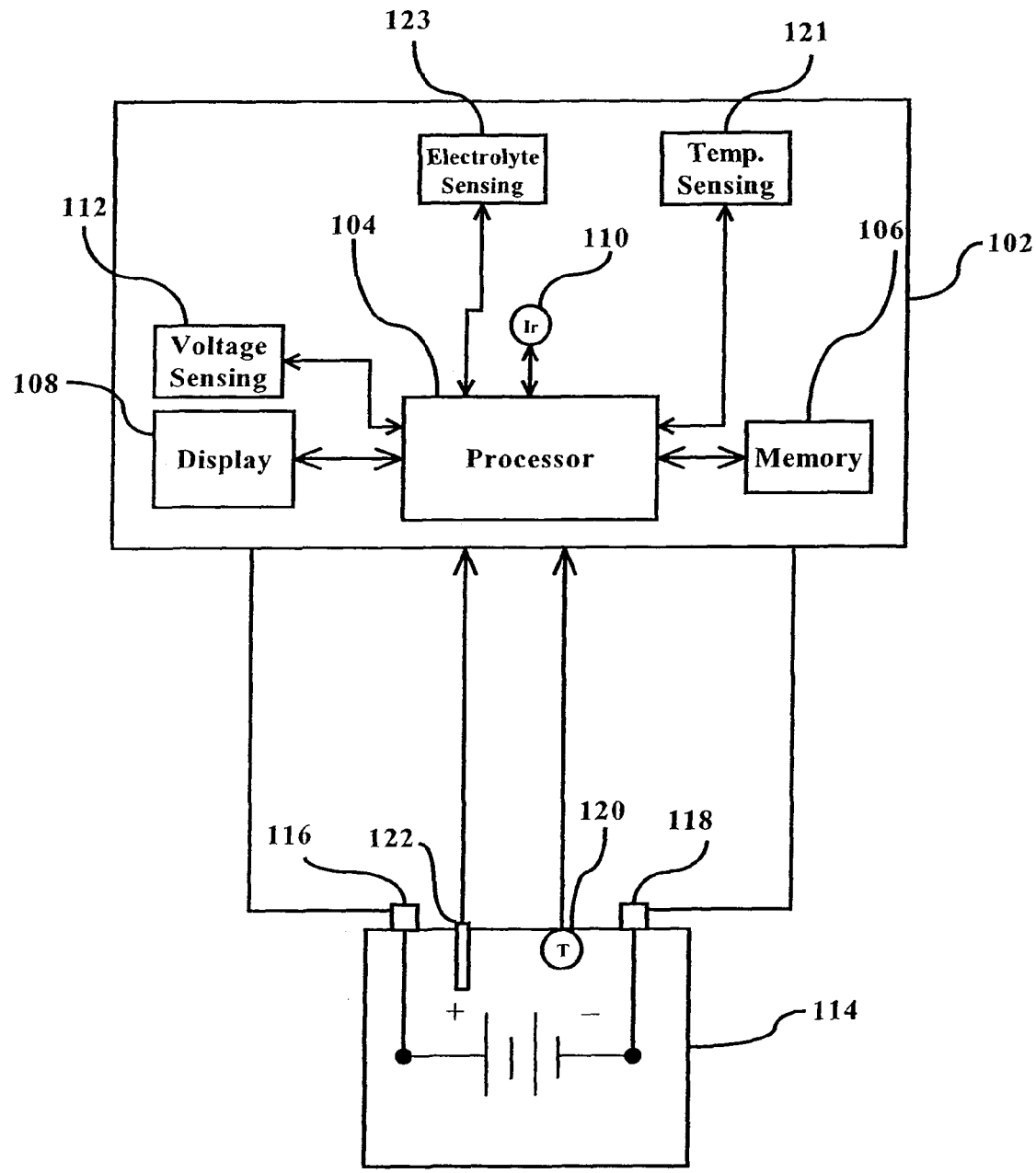
FIG. 1 is a block diagram illustrating a basic configuration of a battery monitoring apparatus in accordance with the present invention.

FIG. 1 is a block diagram illustrating a basic configuration of a battery monitoring apparatus in accordance with the present invention. Referring to FIG. 1, a battery monitor 102 is connected to monitor conditions of a battery 114. More specifically, battery monitor 102 is connected to battery 114 at its positive and negative terminals 116 and 118, respectively, and is configured with voltage sensing circuitry 112 which, in a well known manner, allows the voltage across the battery 114 to be monitored. A temperature sensor 120 is associated with battery 114 in such a manner that it can measure operating temperatures of battery 114 and provide data concerning these temperature measurements to battery monitor 102. For example, temperature probe 120 can be inserted between the cells of battery 114 to provide consistent measured temperature values. Battery 114 can also be configured with an electrolyte level monitor 122, such as that described in U.S. Pat. No. 5,936,382, thus providing data regarding the electrolyte level of battery 114 to battery monitoring device 102.

Battery monitoring device 102 includes a processor 104, memory 106, and a display device 108. One example of a suitable processor is an Arizona Microchip, type 16F877A. Battery monitoring device 102 can also be equipped with an infrared (Ir) port 110 to be used for wireless transfer of data to and from the battery monitoring device 102 when desired. Voltage sensing circuitry 112 monitors the voltage across the battery 114 and provides the data resulting from this monitoring to processor 104. Similarly, temperature probe 120 and temperature sensing circuitry 121 develop data regarding the operating temperature of the battery for processing by processor 104, and electrolyte sensor 122 and electrolyte sensing circuitry 123 develop data regarding the electrolyte levels of the battery for processing by processor 104. In a preferred embodiment of the present invention, monitoring device 102 is affixed to battery 114 during the lifetime of the battery. When battery 114 has reached the end of its useful life, monitoring device 102 can be removed for use on another battery while battery 114 can be recycled. The elements making up battery monitoring device 102 are known elements and further description of these elements is unnecessary for an understanding of how to make and use the invention.

Processor 104 is configured, as described in more detail below, to analyze the data received from the various monitoring locations and store certain data regarding this analysis in memory 106. The data stored is minimal and is related to the time that the battery is operating outside of specifications rather than actual data regarding the operating parameters of the battery. As appropriate, an interpretation of the meaning of the stored data is displayed on display device 108 for a user to see.

Figure 2:
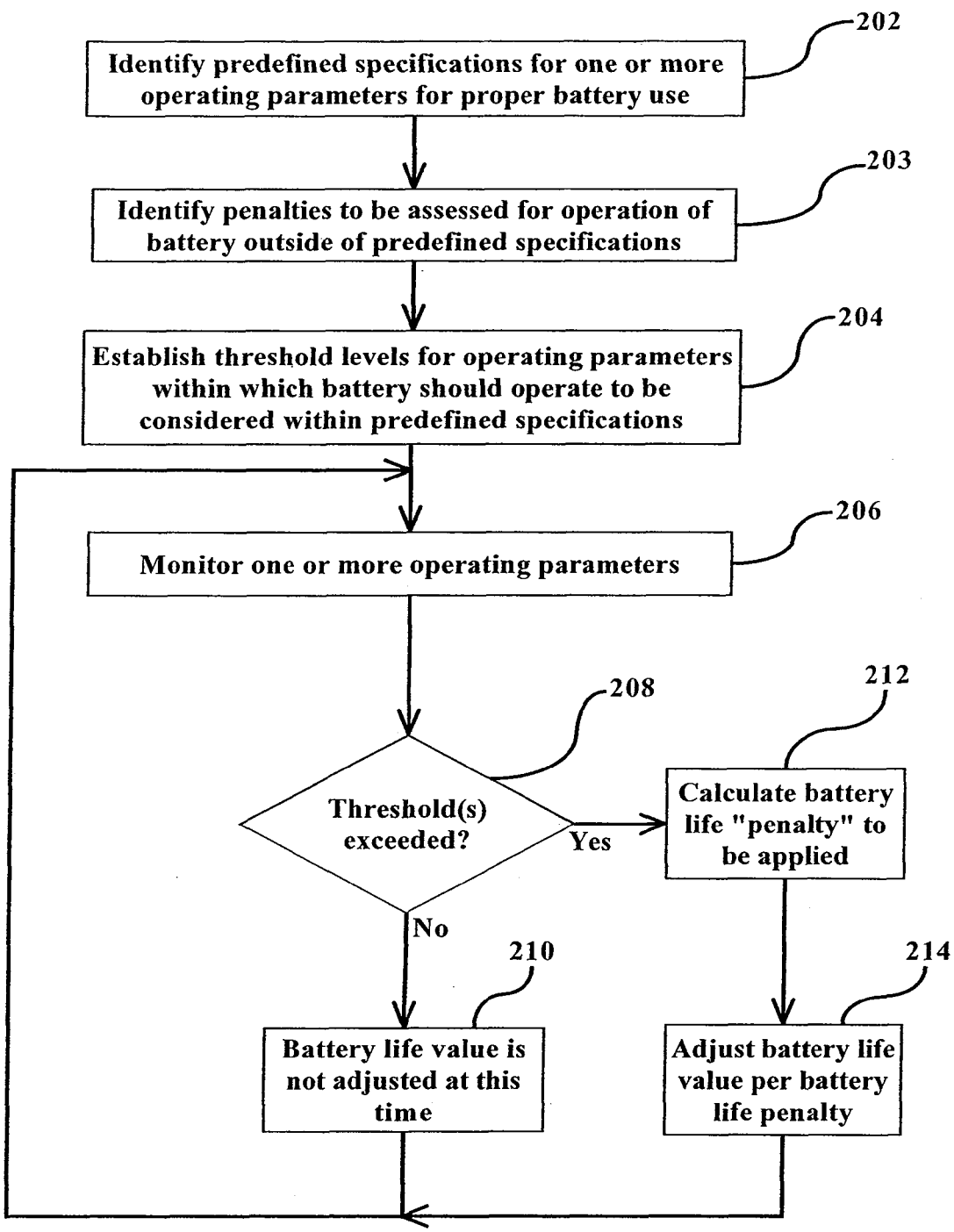
FIG. 2 is a flowchart illustrating the basic operation of the present invention.

FIG. 2 is a flowchart illustrating the basic operation of the present invention and, more particularly, the monitoring and processing aspects of battery monitor 102 of FIG. 1. At step 202, predefined specifications for one or more operating parameters considered to be "proper battery use" are identified. This information can come from manufacturer's specifications, industry standards, studies, and/or customized specifications of an owner of a battery such as a lessor. The parameters can be, for example, predefined specifications for what is considered an acceptable operating temperature, an acceptable voltage per cell, an acceptable electrolyte level, etc. Further, multiple values can be established to establish zones or levels of proper use so that, for example, a first zone, when reached, might be used to indicate that the use was bad but not fatal to the battery, and a second zone which, when entered, can indicate use that is likely to destroy the battery.

At step 203, penalties to be assessed for operation of battery outside of predefined specifications are identified. Like the definition of parameters constituting proper battery use, these penalties can be arbitrarily selected based on customer or design requirements, or based on studies of battery usage that indicates a certain level of loss of battery life associated with a certain type of operation outside of the manufacturer specifications.

At step 204, threshold levels for these operating parameters are established. Proper battery use is any operation that is within the threshold levels. For example, with respect to temperature, it can be decided that any operation of the battery above 40° C. is considered outside of the satisfactory operating parameters for temperature, and thus the acceptable temperature threshold can be set to be less than or equal to 40° C. Similarly, with respect to voltage, a satisfactory voltage can be considered to be greater than 1.8 VPC but less than 2.5 VPC; thus acceptable voltage thresholds can be set at greater than or equal to 1.8 VPC (low voltage threshold) and less than or equal to 2.5 VPC (high voltage threshold).

At step 206, the battery monitor 102 performs its battery monitoring functions; in this example, VPC, temperature, and electrolyte level are continuously monitored. At step 208, a determination is made as to whether or not any of the thresholds have been reached. If no thresholds have been reached, then at step 210, the battery life value, as described in more detail below, is unchanged and the process continues back to step 206 for additional continuous monitoring.

However, if at step 208, a determination is made that one or more of the thresholds have been reached, then the process proceeds to step 212, where a "penalty value" for the battery life is calculated based on the amount of time (number of cycles) that the battery was in the beyond-threshold condition. For example, if it is determined that operation of the battery at an average temperature above the high-temperature threshold exacts a 50% penalty on the life expectancy of the battery, then a number of cycles, proportional to the number of cycles during which the battery was operating in this high-temperature condition multiplied by the 50% penalty, can be added to the accumulated total of elapsed battery cycles of the battery, thereby bringing the battery closer to its estimated end-of-life condition. Thus, if a battery has completed 200 complete actual cycles, and the battery has spent its entire life within this temperature above the threshold level, then a 50% penalty (100 cycles) will be added to the battery life calculation, and the battery will be considered to have completed 300 cycles, thereby shortening its expected life. If the battery had spent only 10% of its life in the excessive temperature condition, then the penalty would only apply to 10% of the 200 actual cycles, or 20 cycles. The penalty in cycle units would then be 50% of 20 cycles, or 10 cycles. Thus, a cycle penalty of 10 cycles would be added to the 200 actual cycles already completed, and the battery would be considered to have completed 210 cycles.

It is understood that penalties as described above are assigned for each parameter monitored by the monitoring device, so that whenever the battery is operating beyond the threshold value for a parameter, penalty cycles will be assessed to the accumulated actual cycle total of the battery. It is understood that the penalty values can be assigned based on industry standards, manufacturer specifications, or be customized based on the specifications of the user. The exact penalty values to be assigned can be selected according to the design specifications given to a designer of the device or by the desires of the user.

At step 214, the battery life is adjusted in accordance with the battery life penalty as described above. The process then proceeds back to step 206 for continued monitoring.

In addition to the novel approach of assigning "penalty cycles" described above, the present invention also takes a novel approach respecting the manner in which the battery monitoring data is stored and used. Prior art systems store actual data values regarding the parameters being monitored, e.g., a running record of the voltage levels, temperatures, etc. In accordance with the present invention, the amount of time that the battery has operated outside of the acceptable-use thresholds for each parameter is stored, rather than storing any actual measurement values of the monitored parameters. This requires significantly less memory. Processor 104 is configured to gather and process the data. An example of processing performed by processor 104 is illustrated below with reference to FIG. 3.

Figure 3:
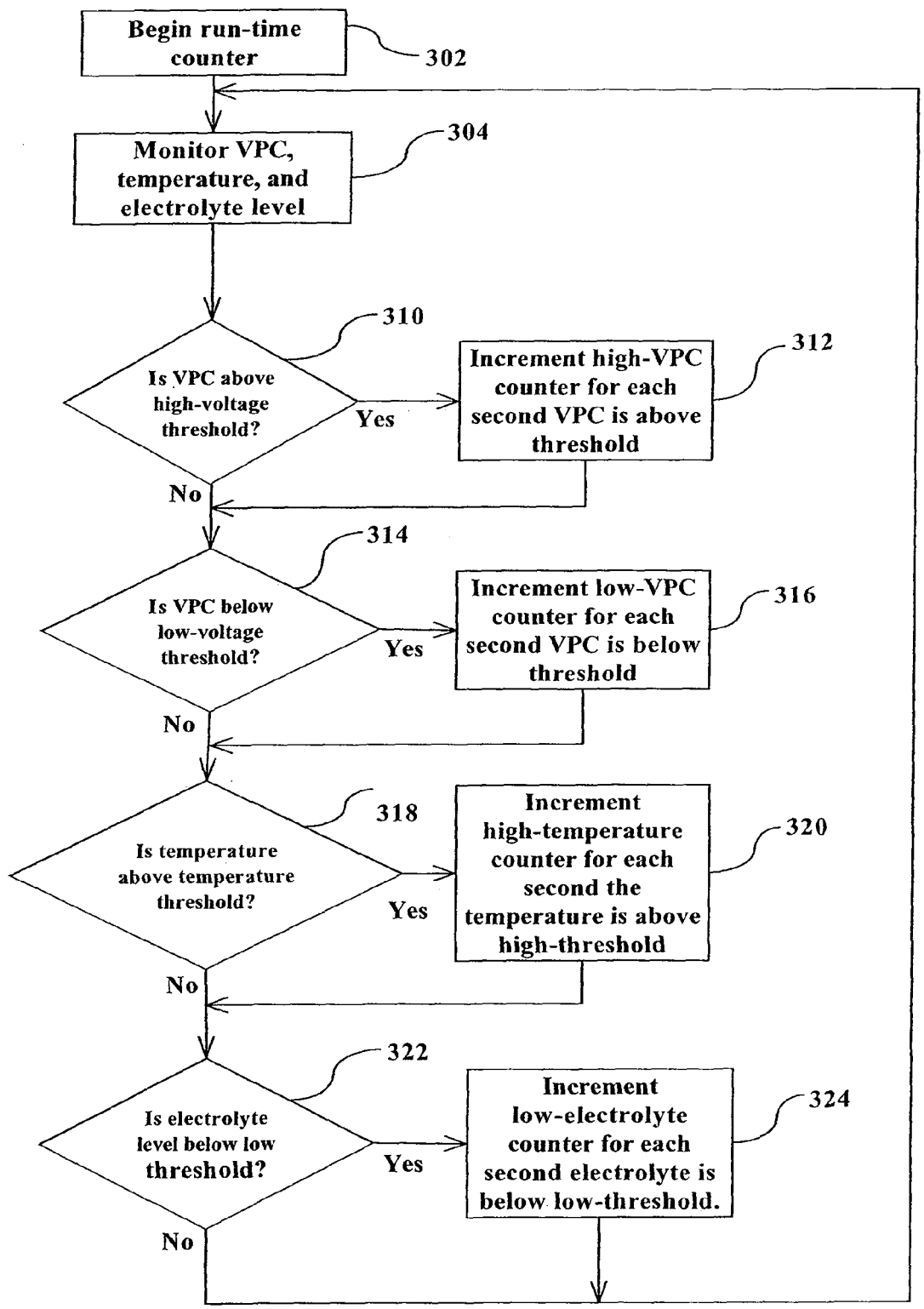
FIG. 3 is a flowchart illustrating a series of basic steps performed to enable storing of data indicative of the time during which a battery is operating outside of the acceptable use standards for the particular battery.

FIG. 3 is a flowchart illustrating a series of basic steps performed to enable storing of data indicative of the time during which a battery is operating outside of the acceptable use standards for the particular battery. The present invention uses cumulative counters, e.g., pulse counters, to track time. For example, a counter configured to count one pulse each second will be able to identify one-minute intervals (60 counted pulses), one-hour intervals (3600 counted pulses) one-day intervals (86,400 pulses), etc. Processor 104 of FIG. 1 is configured to include a "runtime counter" having a regular timing (e.g., one count per second) and which is continually incremented any time the battery monitoring device 102 is powered, i.e., when battery monitoring device 102 is connected across the battery terminals and the battery is charged. Processor 104 is also configured to increment monitoring counters, e.g., temperature monitoring counters, voltage monitoring counters, electrolyte monitoring counters, etc., any time that one of the monitored levels falls outside of its threshold values. The configuration of a processor to perform counting functions is well known and thus is not discussed further herein. When a battery monitored condition falls into one of the out-of-specification conditions as identified by the threshold levels, each of the counters associated with the out-of-specification level will be incremented synchronously with the runtime counter. When the out-of-specification condition is no longer present, the counters cease to increment. This allows the amount of time that the battery was operating outside of the approved specifications to be determined.

Referring to FIG. 3, at step 302 the run-time counter is started. This would typically occur when the battery monitoring device is connected across the terminals of the battery. Simultaneously, when the battery monitor is connected to the battery for the first time or is reconnected after a disconnect, an initialization routine is run by the processor in a well known manner, and a connections counter is incremented by one to indicate a new connection of the monitor to the battery. This allows a record to be kept of the number of times the monitor has been connected to (and thus disconnected from) the battery, which could indicate misuse of the battery monitor for fraudulent purpose (e.g., an attempt by a lessee to make it appear that the battery has been used for less cycles than it actually has).

At step 304, the voltage, battery temperature, and electrolyte levels are monitored. The processor is configured to trigger the operation of certain counters when the measured parameters fall outside the threshold values established for the various parameters. Multiple counters can be utilized for each parameter if desired, allowing for high resolution in the monitoring of the parameters.

At step 310 a determination is made as to whether or not the VPC has exceeded the high-voltage threshold. If the high-voltage threshold has been exceeded, then at step 312 a high-VPC counter is incremented coincident with the timing of the run-time counter during the period during which the VPC exceeds the high-voltage threshold. Since the timing of the run-time counter is known, the time that the battery has been run at a voltage level exceeding the specifications can be calculated. The process then proceeds to step 314.

If at step 310 it is determined that the high-voltage threshold has not been exceeded, then the process proceeds directly to step 314. At step 314, a determination is made as to whether or not the VPC of the battery has dropped below the low-voltage threshold. If the VPC has dropped below the low-voltage threshold, the process proceeds to step 316, where a low-voltage counter is incremented coincident with the timing of the run-time counter during the period during which the VPC is below the low-voltage threshold. Since the timing of the run-time clock is known, the time that the battery has been operated at a VPC below the specifications can be calculated. The process then proceeds to step 318.

If at step 314 it is determined that the VPC is not less than the low-voltage threshold, the process proceeds directly to step 318. At step 318 a determination is made as to whether or not the temperature of the battery has risen above the high-temperature threshold. If the high-temperature threshold has been exceeded, the process proceeds to step 320, where a high-temperature counter is incremented coincident with the timing of the run-time counter during the period during which the VPC is above the high-temperature threshold. Since the timing of the run-time clock is known, the time that the battery has been operated at a temperature above the specifications can be calculated. The process then proceeds to step 322.

If at step 318 it is determined that the temperature of the battery has not exceeded the high-temperature threshold, then the process proceeds directly to step 322. At step 322 a determination is made as to whether or not the minimum acceptable level of electrolyte is present in the battery. If it is determined that the minimum level of electrolyte is not present in the battery, the process proceeds to step 324 where an electrolyte-low counter is incremented coincident with the timing of the run-time counter during the period during which the electrolyte is below the minimum acceptable level. Since the timing of the run-time clock is known, the time that the battery has been operated with the electrolyte below the minimum acceptable level can be calculated. The process then proceeds to step 318. If desired, the processing described in step 324 can be delayed until the "below-minimum" condition has been sensed for a predetermined period of time, e.g., 24 hours, to make sure that the dropping of the electrolyte below acceptable levels is not merely a transient event resulting from charging tides.

If at step 322 it is determined that the electrolyte level has not dropped below the minimum acceptable level, then the process proceeds back to step 304 and the monitoring process continues as described above.

The result of the above-described monitoring is that the amount of time that a particular value is out-of-specification is recorded by the appropriate counter(s). Then, using the battery life penalty described above, calculations can easily be made to apply the penalties to the battery life calculation. The process described in FIG. 3 is a simplified process for the purpose of explanation. In the examples of FIG. 3, there is a single high voltage threshold, a single low voltage threshold, a single high temperature threshold, and a single electrolyte-level threshold, and each of these thresholds has a single counter associated therewith. However, it is understood and contemplated that multiple counters can be utilized for each parameter, with multiple threshold levels if desired. This can allow for the assigning of certain ranges of parameters to certain counters, so that conditional counting, such as "low electrolyte level," "dangerously low electrolyte level," "approaching high voltage condition," "high voltage condition," etc. can be utilized. This would allow warnings to be displayed to users and could be used to give users an idea of how far above a threshold a particular parameter is, etc.

Figure 4:
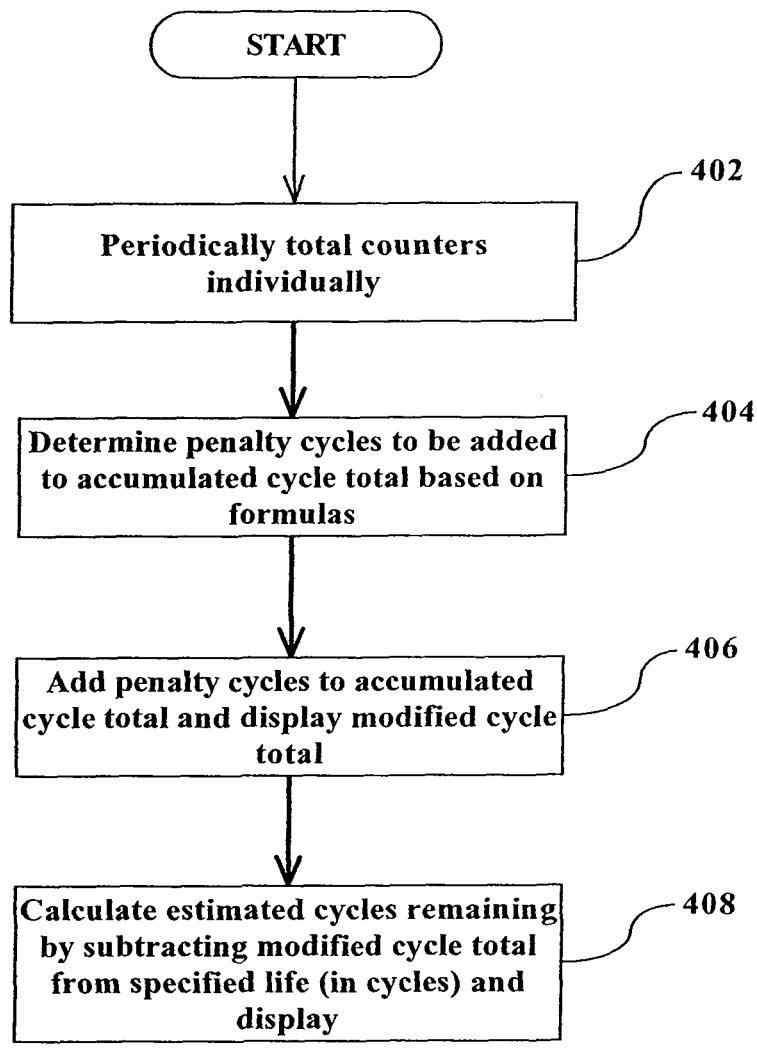
FIG. 4 is a flowchart illustrating an example of a process used to calculate the remaining life of a battery, using the principles of the present invention.

FIG. 4 is a flowchart illustrating an example of a process that can be followed to calculate an "estimated cycles remaining" value for a battery in accordance with the present invention. At step 402, the count values of the various counters are periodically retrieved by processor 104. At step 404, the particular number of penalty cycles to be added to the accumulated actual cycle total is determined. The number of penalty cycles is based upon the amount of time that the various parameters were exceeded and the formulas identified in step 203 of FIG. 2. At step 406, penalty cycles are added to the accumulated actual cycle total, based upon the determination made in step 404, results in an "adjusted" cycle total that may be displayed if desired. At step 408, the estimated cycles remaining for the battery are calculated by subtracting the adjusted cycle total from the manufacturer-specified life (in cycles) of the battery, and this value can be displayed as well.

If desired the counters can be reset after the retrieval step in preparation for their counting of additional time that the battery is operating outside the specified parameters. If this is done, separate counters may be used so that one counter per parameter keeps a running total (and is thus not reset) while a second counter for each parameter keeps a count of the operations of the battery outside the parameters since the last retrieval of data from the counters. This resetting is optional and is not required, however.

The calculation of the penalty cycles and their application to the data for a particular battery can be performed using processor 104 and memory 106, as long as processor 104 has access to the penalty calculations needed for the particular battery on which the battery monitor 102 is mounted. Many of the penalty calculations will vary based on the battery type and, in the case of a leased battery, the penalties agreed to between the lessor and the lessee. As long as the formulas to calculate the penalty cycles are stored in memory 106, then the penalties can be calculated by the battery monitor 102 itself. However, to avoid having to separately program each battery monitor according to the battery type and/or lease terms, the various formulas could be stored in a PDA or other device capable of communicating with the battery monitor 102 (e.g., via Ir port 110) and they could be made available for use by processor 104 on an as needed basis by whoever controls the application of the penalties, e.g., the lessee. This would also allow the control person to make the changes to the various penalty formulas once, on the PDA or other device, and then have them available to use with any battery as needed.

Figure 5:
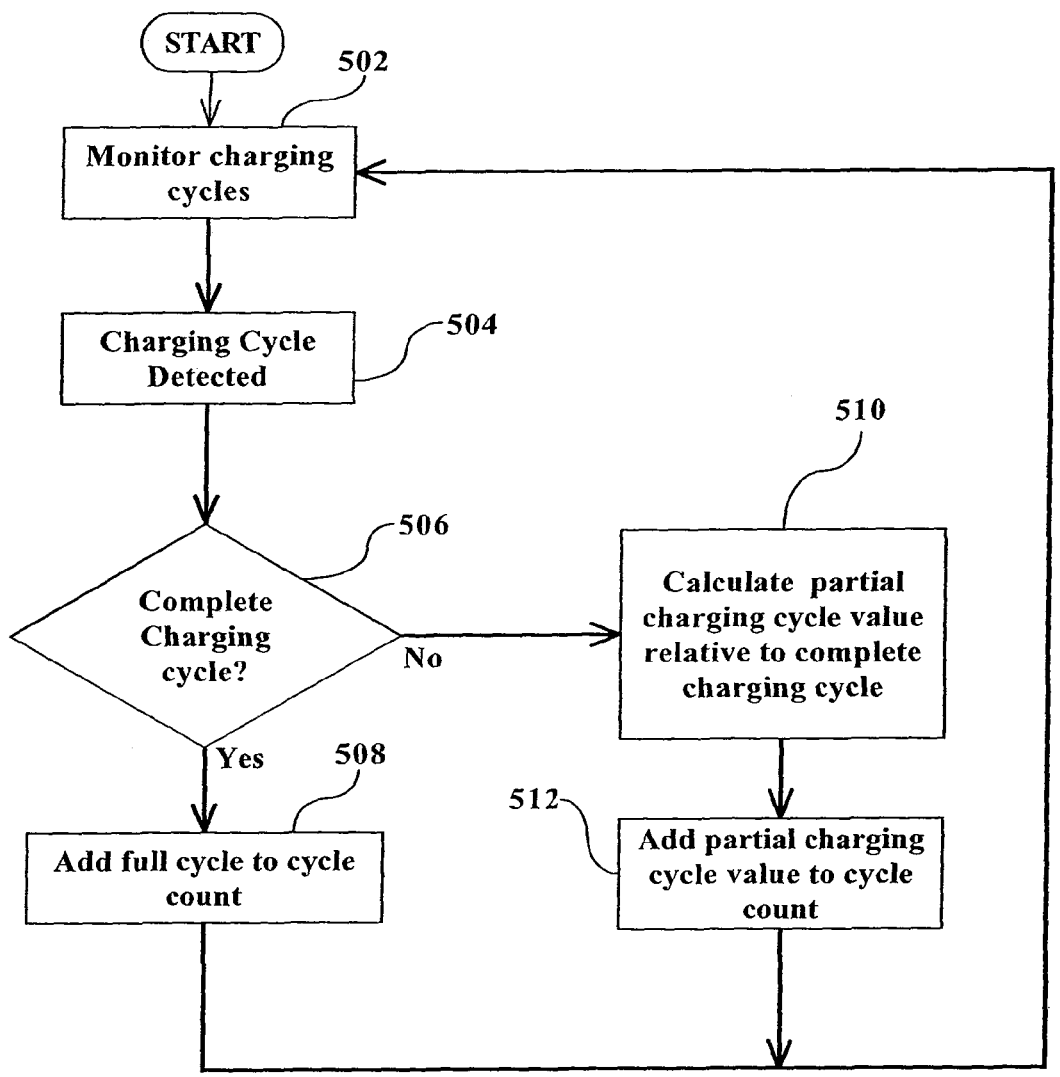
FIG. 5 is a flowchart illustrating an example of a process for calculating partial cycles and including the partial cycles in the overall cycle count for a battery.

FIG. 5 is a flowchart illustrating the calculation and accumulation of partial charging cycles. As used herein, the terms "complete charging cycle" or "full charging cycle" means the discharging of a battery followed by charging of the battery to a complete or fully charged state. For the purpose of this invention, the amount of discharge of the battery prior to instituting the complete or full charge is not relevant, although it is recognized that some narrower definitions of a "full charging cycle" or "complete charging cycle" would also require a discharge of the battery to a predetermined level prior to completely recharging the battery. For the purpose of this invention, the term "partial charge cycle" means any time a battery has been discharged and then is recharged, but not to a fully or completely charged state. Partial charge cycles frequently occur when "opportunity charging" is practiced, such as in a warehouse where a forklift operator might put a forklift battery on a charger during a 15-minute break and then go back to work prior to completion of the charge of the battery.

By counting partial charging cycles relative to a complete charging cycle and then adding the partial charging cycle to the total cycle count, a more accurate estimate of the remaining life of the battery can be achieved. At step 502, the charging operation of the battery is monitored. At step 504, a charging cycle is detected, and at step 506, a determination is made as to whether or not the charging cycle is a complete charging cycle or a partial charging cycle. To have a more accurate count of charging cycles, the present invention counts both full charging cycles and partial charging cycles, and then calculates a partial charging cycle value relative to a complete charging cycle (step 510) and then adds the partial charging cycle value to the cycle count (step 512). A full charging cycle is, of course, added to the cycle count as a complete cycle (step 508).

By calculating the percentage of a partial charging cycle relative to a full charging cycle, a more realistic evaluation of the number of charging cycles that the battery has gone through is available. For example, if a charging cycle is only 50% of a complete cycle, then one-half of a cycle will be added to the cycle count, in contrast to the prior art which would either add a complete cycle to the cycle count or no cycle to the cycle count. In this way, a more realistic evaluation of the number of charging cycles is available.

An example of a typical day of full and partial charging could involve the following activity: (1) discharge battery for two hours; (2) recharge for thirty minutes; (3) discharge for two hours; (4) recharge for one hour; (5) discharge for two hours; (6) recharge for thirty minutes; (7) discharge for one hour; (8) full recharge overnight.

If it is assumed that an eight-hour recharge is considered a full charge (such as would occur for the overnight charge), then the process above consists of one full cycle for the full recharge (item 8), and two hours of partial recharge cycles (items 3, 5, and 7). Based on an eight-hour full-recharge, the two hours of partial charging is equal to 0.25 cycles (%ths of a cycle). Thus, for the day described above, the present invention would count one full cycle plus 0.25 cycles, for a total of 1.25 cycles for that day.

It will be apparent that the use of counters to monitor the operation of the battery as described herein makes possible numerous other benefits in addition to those detailed above. For example, counters can be included to record the highest and lowest voltage the battery has reached during its life. A counter can also be configured to count "operational days" so that for each 24-hour period the battery is in operation, the operational day counter will increment by one. Used in connection with the high and low voltage counters, it can be determined which days ($3^{rd}$ day, $5^{th}$ day, $230^{th}$ day, etc.) during the operation of the battery the high and low voltages occurred. If desired, any or all of this information can be displayed to a user, technician, etc. Further, this information can be monitored and displayed for any parameters monitored by the battery monitor of the present invention.

Further, the battery monitor of the present invention can also be configured to control an electrolyte mixing system such as Philadelphia Scientifics' HYDRO MIX electrolyte mixing system and/or a fully automatic watering system such as Philadelphia Scientifics' HYDRO FILL automatic watering system. Each of these types of systems operate based on the occurrence of a particular charging condition or measured levels of charging, voltage and/or electrolyte levels. By configuring the counters of the present invention to identify control states related to the mixing and/or watering systems, control signals can be issued when these control states have been achieved, thereby providing automatic control for the mixer and/or watering system. This can make the battery essentially maintenance free.

The present invention derives multiple battery activities (full charging cycles, partial charging cycles, penalty values based on use of the battery outside of manufacturers specifications) into the same units, i.e. charging cycles, which enables the use of the calculated penalty cycles to reduce the estimated number of charging cycles remaining for the battery. The units could instead be all derived to units of time, so that penalty times are used to reduce the estimated remaining life of the battery instead of penalty cycles; however, the use of penalty cycles is preferred because different batteries may be used differently over the same time period and this reduces the resolution of the penalty calculation.

The above-described steps can be implemented using standard well-known programming techniques. The novelty of the above-described embodiment lies not in the specific programming techniques but in the use of the steps described to achieve the described results. Software programming code which embodies the present invention is typically stored in permanent storage of some type, such as permanent storage of the battery monitor itself or on a PDA or other device being used in connection with the battery monitor. In a client/server environment, such software programming code may be stored with storage associated with a server. The software programming code may be embodied on any of a variety of known media for use with a data processing system, such as a diskette, or hard drive, or CD-ROM. The code may be distributed on such media, or may be distributed to users from the memory or storage of one computer system over a network of some type to other computer systems for use by users of such other systems. The techniques and methods for embodying software program code on physical media and/or distributing software code via networks are well known and will not be further discussed herein.

Although the present invention has been described with respect to a specific preferred embodiment thereof, various changes and modifications may be suggested to one skilled in the art and it is intended that the present invention encompass such changes and modifications as fall within the scope of the appended claims.

We claim:

1. A method of monitoring the operation of a battery, comprising:
   determining a life expectancy of said battery as measured in charging cycles;
   identifying at least one threshold value for at least one battery parameter, wherein traversal of said at least one threshold indicates operation of said battery outside of at least one predetermined specification of said battery;
   counting the amount of time that said at least one threshold is traversed;
   assigning a penalty value, in charging cycles, wherein the number of charging cycles is proportional to a predetermined amount of said counted time;
   calculating a penalty amount, in charging cycles, based on said assigned penalty value and said predetermined amount of said counted time; and
   adding said penalty amount to a number of actual elapsed charging cycles of said battery, thereby reducing the estimated number of charging cycles remaining in the life of said battery by said penalty amount.

2. The method of claim 1, wherein said counting step is performed by at least one cumulative counter.

3. The method of claim 1, wherein said at least one parameter is voltage per cell of said battery, and wherein said at least one threshold comprises a predetermined high voltage per cell.

4. The method of claim 1, wherein said at least one parameter is voltage per cell of said battery, and wherein said at least one threshold comprises a predetermined low voltage per cell.

5. The method of claim 1, wherein said at least one parameter is battery temperature, and wherein said at least one threshold comprises a predetermined high battery temperature.

6. The method of claim 1, wherein said at least one parameter is electrolyte level of said battery, and wherein said at least one threshold comprises a predetermined minimum electrolyte level.

7. The method of claim 1, further comprising:
   identifying a first threshold value for a first battery parameter, wherein traversal of said first threshold value indicates operation of said battery outside of a first predetermined specification of said battery;
   identifying a second threshold value for a second battery parameter, wherein traversal of said second threshold value indicates operation of said battery outside of a second predetermined specification of said battery;
   counting the amount of time that at least one of said first and second threshold values is traversed; and
   calculating said penalty amount based on the amount of counted time.

8. The method of claim 7, further comprising:
   identifying a third threshold value for said second battery parameter, wherein traversal of said third threshold value indicates operation of said battery outside of a third predetermined specification of said battery;
   counting the amount of time that at least one of said first, second, and third threshold values is traversed; and
   calculating said penalty amount based on the amount of counted time.

9. The method of claim 7, further comprising:
   identifying a third threshold value for said third battery parameter, wherein traversal of said third threshold value indicates operation of said battery outside of a third predetermined specification of said battery;
   counting the amount of time that at least one of said first, second, and third threshold values is traversed; and
   calculating said penalty amount based on the amount of counted time.

10. A device for monitoring the operation of a battery, wherein the life of said battery is counted in charging cycles, comprising:
    means for identifying at least one threshold value for at least one battery parameter, wherein traversal of said at least one threshold indicates operation of said battery outside of at least one predetermined specification of said battery;
    means for counting the amount of time that said at least one threshold is traversed;
    means for assigning a penalty value, in charging cycles, wherein the number of charging cycles is proportional to a predetermined amount of said counted time;
    means for calculating a penalty amount in charging cycles based on said assigned penalty value and said predetermined amount of said counted time; and
    means for adding said penalty amount to a number of actual elapsed charging cycles of said battery, thereby reducing the estimated number of charging cycles remaining in the life of said battery by said penalty amount.

11. The device of claim 10, wherein said means for counting comprises a cumulative counter.

12. The device of claim 10, wherein said at least one parameter is voltage per cell of said battery, and wherein said at least one threshold comprises a predetermined high voltage per cell.

13. The device of claim 10, wherein said at least one parameter is voltage per cell of said battery, and wherein said at least one threshold comprises a predetermined low voltage per cell.

14. The device of claim 10, wherein said at least one parameter is battery temperature, and wherein said at least one threshold comprises a predetermined high battery temperature.

15. The device of claim 10, wherein said at least one parameter is electrolyte level of said battery, and wherein said at least one threshold comprises a predetermined minimum electrolyte level.

16. The device of claim 10, further comprising:
    means for identifying a first threshold value for a first battery parameter, wherein traversal of said first threshold value indicates operation of said battery outside of a first predetermined specification of said battery;
    means for identifying a second threshold value for a second battery parameter, wherein traversal of said second threshold value indicates operation of said battery outside of a second predetermined specification of said battery; and
    means for counting the amount of time that at least one of said first and second threshold values is traversed;
    wherein said penalty amount is calculated based on the amount of counted time.

17. The device of claim 16, further comprising:
    means for identifying a third threshold value for said second battery parameter, wherein traversal of said third threshold value indicates operation of said battery outside of a third predetermined specification of said battery; and means for counting the amount of time that at least one of said first, second, and third threshold values is traversed;

wherein said penalty amount is calculated based on the amount of counted time.

18. The device of claim 16, further comprising:

means for identifying a third threshold value for a third battery parameter, wherein traversal of said third threshold value indicates operation of said battery outside of a third predetermined specification of said battery; and means for counting the amount of time that at least one of said first, second, and third threshold values is traversed;

wherein said penalty amount is calculated based on the amount of counted time.

19. A method of monitoring the operation of a battery, comprising:
   a. determining a life expectancy of said battery as measured in charging cycles;
   b. identifying at least one threshold value for at least one battery operating parameter, wherein traversal of said at least one threshold indicates operation of said battery outside of at least one predetermined operational specification of said battery;
   c. calculating, as a percentage of the total operational time for said battery, the amount of time that said at least one threshold is traversed;
   d. calculating a number of charging cycles proportional to said calculated percentage of operational time;
   e. adjusting said calculated number of charging cycles by a penalty factor based on said traversed threshold and;
   adjusting said life expectancy of said battery by said adjusted number of charging cycles.

20. The method of claim 19 wherein said adjustment represents an increase in the number of charging cycles already used.

21. The method of claim 19 wherein said adjustment represents an reduction in the number of charging cycles in the life expectancy of said battery.

22. The method of claim 19 wherein said amount of time that said at least one threshold is traversed s counted by at least one cumulative counter.

23. The method of claim 19 wherein said at least one parameter is voltage per cell of said battery, and wherein said at least one threshold comprises a predetermined high voltage per cell.

24. The method of claim 19 wherein said at least one parameter is voltage per cell of said battery and wherein said at least one threshold comprises a predetermined low voltage per cell.

25. The method of claim 19 wherein said at least one parameter is battery temperature and wherein said at least one threshold comprises a predetermined high battery temperature.

26. The method of claim 19 wherein said at least one parameter is electrolyte level and wherein said at least one threshold comprises a predetermined minimum electrolyte level.

27. The method of claim 19 further comprising:

assigning a penalty value, in charging cycles, to a predetermined amount of said counted time;

calculating a penalty amount, in charging cycles, corresponding to the amount of counted time counted by said cumulative counter; and adding said penalty amount to a number of actual elapsed charging cycles of said battery, thereby reducing the estimated number of charging cycles remaining in the life of said battery by said penalty amount.

28. The method of claim 19 further comprising:

identifying a plurality of threshold values for one or more battery parameters;

counting the amount of time that any identified threshold is traversed; and performing steps c, d, and e based on said counted time that any identified threshold is traversed.

* * * * *